(12) United States Patent
Nagahori et al.

(10) Patent No.: US 6,181,454 B1
(45) Date of Patent: Jan. 30, 2001

(54) ADAPTIVE THRESHOLD CONTROLLED DECISION CIRCUIT IMMUNE TO RINGING COMPONENTS OF DIGITAL SIGNALS

(75) Inventors: Takeshi Nagahori; Ichiro Hatakeyama; Kazunori Miyoshi, all of Toyko (JP)

(73) Assignee: NEC Corporation, Tokyo (JP)

(*) Notice: Under 35 U.S.C. 154(b), the term of this patent shall be extended for 0 days.

(21) Appl. No.: 09/064,505

(22) Filed: Apr. 23, 1998

(30) Foreign Application Priority Data

Apr. 23, 1997 (JP) .................................................. 9-105069

(51) Int. Cl.[7] .................................................. H04B 10/06
(52) U.S. Cl. .................................................. 359/189; 330/9
(58) Field of Search .................................................. 359/189, 194; 330/308, 279, 281; 327/104, 239; 455/232.1, 242.1, 242.2, 296, 244.1

(56) References Cited

U.S. PATENT DOCUMENTS

| | | | |
|---|---|---|---|
| 5,214,319 | 5/1993 | Abdi | 307/351 |
| 5,498,993 | 3/1996 | Ohtsuka et al. | 327/514 |
| 5,612,810 | 3/1997 | Inami et al. | 359/189 |
| 5,892,609 | * 4/1999 | Saruwatari | 359/189 |
| 5,955,918 | * 9/1999 | Uno | 330/9 |
| 6,018,407 | * 1/2000 | Hatakeyama et al. | 359/189 |

FOREIGN PATENT DOCUMENTS

| | | |
|---|---|---|
| 0 339 727 | 11/1989 | (EP) . |
| 59-196636 | 11/1984 | (JP) . |
| 62-206947 | 9/1987 | (JP) . |
| 2-266630 | 10/1990 | (JP) . |
| 7-131489 | 5/1995 | (JP) . |
| 8-84160 | 3/1996 | (JP) . |
| 8-288757 | 11/1996 | (JP) . |
| 8-293838 | 11/1996 | (JP) . |
| 9-214567 | 8/1997 | (JP) . |
| 9-331363 | 12/1997 | (JP) . |

* cited by examiner

Primary Examiner—Leslie Pascal
Assistant Examiner—Chau M. Nguyen
(74) Attorney, Agent, or Firm—McGinn & Gibb, P.C.

(57) ABSTRACT

In an optical receiver, a photodiode converts an optical digital input signal to an electrical signal which is fed into a differential amplifier to produce a pair of true and complementary output signals. The true output signal is received by a peak detector and the output of this peak detector is summed in a first adder with the complementary output of the differential amplifier. The true output of the amplifier is summed in a second adder with a predetermined constant voltage. Difference between the output signals of the first and second adders is detected and compared with a decision threshold to produce an output signal at one of two logical levels depending on whether the difference is higher or lower than the decision threshold. Preferably, a second peak detector having a substantially similar operating characteristic to that of the first peak detector is connected between the source of the predetermined constant voltage and the second adder.

30 Claims, 4 Drawing Sheets

ADAPTIVE THRESHOLD CONTROLLED DECISION CIRCUIT IMMUNE TO RINGING COMPONENTS OF DIGITAL SIGNALS

BACKGROUND OF THE INVENTION

1. Field of the Invention

The present invention relates to an adaptive threshold controlled decision circuit suitable for receiving optical digital signals contaminated with ringing components.

2. Description of the Related Art

In computers and communications equipment, optical interconnection networks are used to transfer optical binary signals between LSI circuits with no format conversion. As constituent elements of the interconnection networks, attention is currently focused on DC-mode optical receivers capable of receiving binary digits of the same value which last for an indefinitely long period of time. Since the required transmission rate is more than several 100 of megabits per second, DC-mode optical receivers with a constant decision threshold and a dynamic range of 10 to 15 dB are not practical because of the difficulty to support a sufficient bandwidth to meet the speed requirement. AC-mode optical receivers are also known in the art. This type of optical receivers is used in combination with a coding circuit as an optical data link to take the benefit of its excellent sensitivity characteristic to low optical input levels.

An important factor to be taken into consideration in the design of an optical receiver is the generation of noise-like components, or "ringing", caused by electrical crosstalk between optical transmitters. The ringing occurs on both high and low level laser outputs when laser diodes are driven at logical-1 (i.e., mark) and logical-0 level (i.e., space), respectively. Although the ringing that occurs at low level laser output can be reduced to a minimum by setting the bias current of laser diodes at a value sufficiently lower than their threshold level, it is impossible to eliminate the ringing that occurs at high level laser output.

As shown in FIG. 1, a prior art optical receiver disclosed in Japanese Laid-Open Patent Specification Hei-8-84160 includes a photodiode 1 for converting optical unipolar input pulses (see FIG. 1) to an electrical current signal which is fed to a differential preamplifier 2. The preamplifier produces a pair of voltage signals of opposite logic levels. The true output of the preamplifier is supplied to a peak detector 3 and an adder 5, and the complementary output is supplied to a peak detector 4 and an adder 6. The difference between the outputs of adders 5 and 6 is determined by a subtractor 7. As a result, the decision levels of a decision circuit 8, or Schmitt trigger are adaptively controlled by the input signal. When the difference output of subtractor 7 is higher than threshold $V_H$, the output of decision circuit 8 goes high and when it reduces to a level lower than threshold $V_L$, the output of decision circuit 8 goes low.

As shown in FIG. 2, when the optical input level is low, there is no ringing component. After two successive cycles of marks and spaces, the optical input is maintained at a high level which is rich in ringing components. If no ringing were present, the output of subtractor 7 would steadily decay and stay at a midpoint of the two threshold values, so that the optical receiver could be used as a DC-mode optical receiver. However, due to the presence of ringing component, the difference signal crosses the high and low threshold levels in rapid succession, producing error pulses. Since the amplitude of the ringing component is proportional to the optical input power, this ringing problem will become serious and the implementation of a DC-mode optical receiver operating on a high optical input level becomes difficult. On the other hand, if the optical input contains no DC components, the prior art optical receiver can still be used as an excellent AC-mode optical receiver.

Furthermore, optical receivers are used in both interconnection networks and data links and demand for such applications is enormous, there is therefore a need for dual mode optical receivers.

Japanese Laid-Open Patent Specifications Sho-62-206947 and Hei-2-266630 disclose DC-mode optical receivers immune to ringing components. However, it is impossible to modify the prior art DC-mode optical receivers into AC-mode optical receivers to be used in tandem connection while canceling offset components.

SUMMARY OF THE INVENTION

It is therefore an object of the present invention to provide an adaptive threshold controlled decision circuit which is immune to ringing components and is capable of being used in both DC and AC modes.

According to one aspect of the present invention, there is provided a circuit arrangement comprising an amplifier for producing a true output signal and a complementary output signal in response to a digital input signal, a peak detector for receiving the true output signal, a first adder for summing the complementary output signal and an output signal of the peak detector, and a second adder for summing the true output signal and a predetermined constant voltage. Difference between the output signals of the first and second adders is detected. A decision circuit makes a decision on the difference signal to produce a digital output signal. Preferably, a second peak detector having a substantially similar operating characteristic to that of the first peak detector is connected between the source of the constant voltage and the second adder.

According to a second aspect, the present invention provides a circuit arrangement comprising an amplifier for producing a true output signal and a complementary output signal in response to a digital input signal, a first peak detector for receiving the true output signal, a second peak detector for receiving the complementary output signal, a first adder for summing the complementary output signal with an output signal of the first peak detector, a second adder for receiving the true output signal and switching circuitry, responsive to a first control signal, for causing a predetermined constant voltage to be summed by the second adder with the true output signal, and responsive to a second control signal, for causing an output signal of the second peak detector to be summed by the second adder. Difference between the output signals of the first and second adders is detected. A decision circuit makes a decision on the difference signal to produce a digital output signal. Preferably, each of the first and second peak detectors has a variable time constant value, and wherein the switching circuitry comprises means for setting the time constant values of the first and second peak detectors at a lower value in response to the first control signal, and setting the time constant values of the first and second peak detectors at a higher value in response to the second control signal.

BRIEF DESCRIPTION OF THE DRAWINGS

The present invention will be described in further detail with reference to the accompanying drawings, in which.

DETAILED DESCRIPTION

Figure 3:
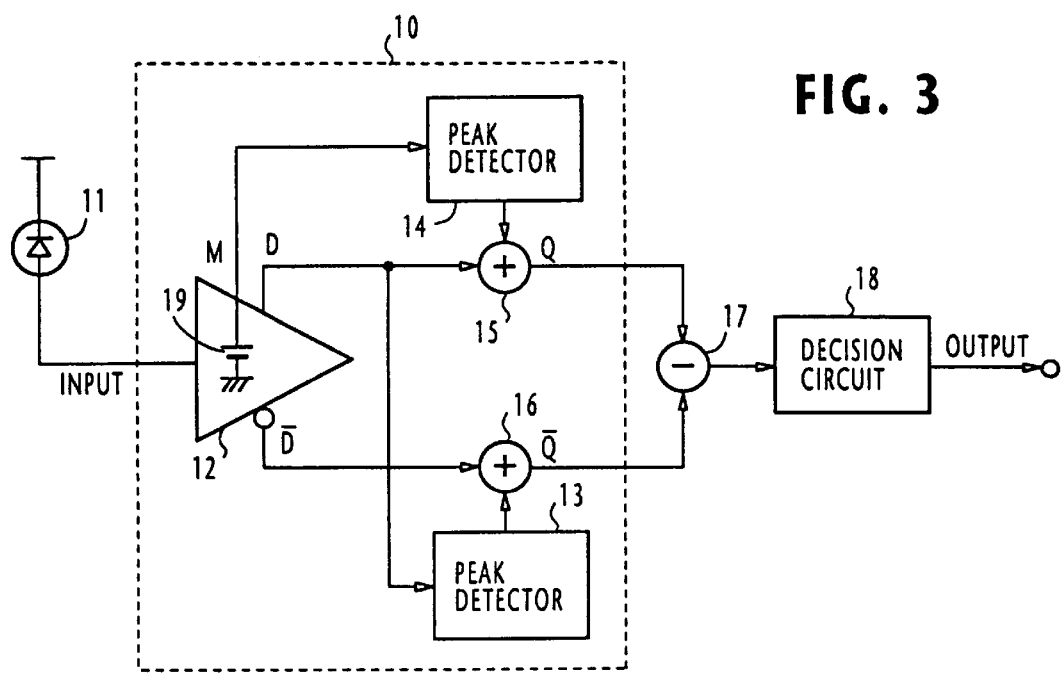
FIG. 3 is a block diagram of an optical receiver according to one embodiment of the present invention.

In FIG. 3, the optical receiver of this invention comprises a photodiode 11 for converting optical unipolar input pulses to an electrical current signal which is fed to a differential preamplifier 12 of an adaptive threshold controlled decision circuit. The preamplifier produces a pair of voltage signals of true and complementary logic levels. The true output of the preamplifier is supplied to a peak detector 13 and an adder 15.

According to this invention, the complementary output of differential preamplifier 12 is supplied only to an adder 16 where it is summed with the output of peak detector 13, and the differential preamplifier 12 has a constant DC voltage supply circuit 19 which feeds a peak detector 14 which is identical in time-constant characteristic to the peak detector 13. Adder 15 combines the true output of differential amplifier 12 with the output of peak detector 14. Peak detectors 13 and 14 are of identical circuit configuration.

Difference between the outputs of adders 15 and 16 is determined by a subtractor 17 and then compared by a decision circuit or Schmitt trigger 18 with a decision threshold $V_{th}$. When the difference output of subtractor 17 is higher than threshold $V_{th}$, the output of decision circuit 18 is high. Otherwise, the output of decision circuit 18 is low.

The voltage produced by the DC voltage supply circuit 19 is a DC voltage of constant level M which is set equal to an average value of the true and complementary output voltages of the differential amplifier 12. This constant DC voltage M is coupled via the peak detector 14 to the adder 15 and summed with the amplifier's true output. The purpose of the peak detector 14 is to cancel the internal offset voltage of the peak detector 13.

Figure 1:
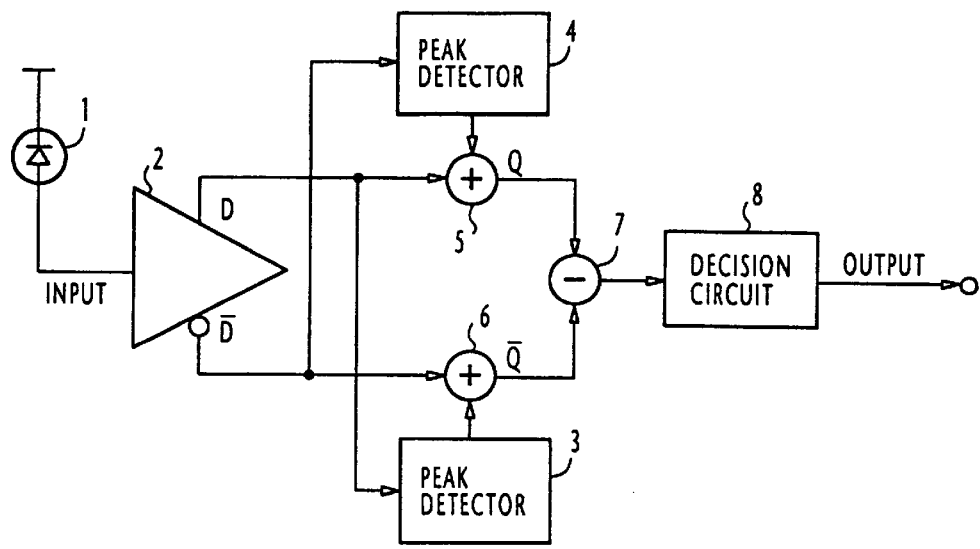
FIG. 1 is a block diagram of a prior art optical receiver.
Figure 2:
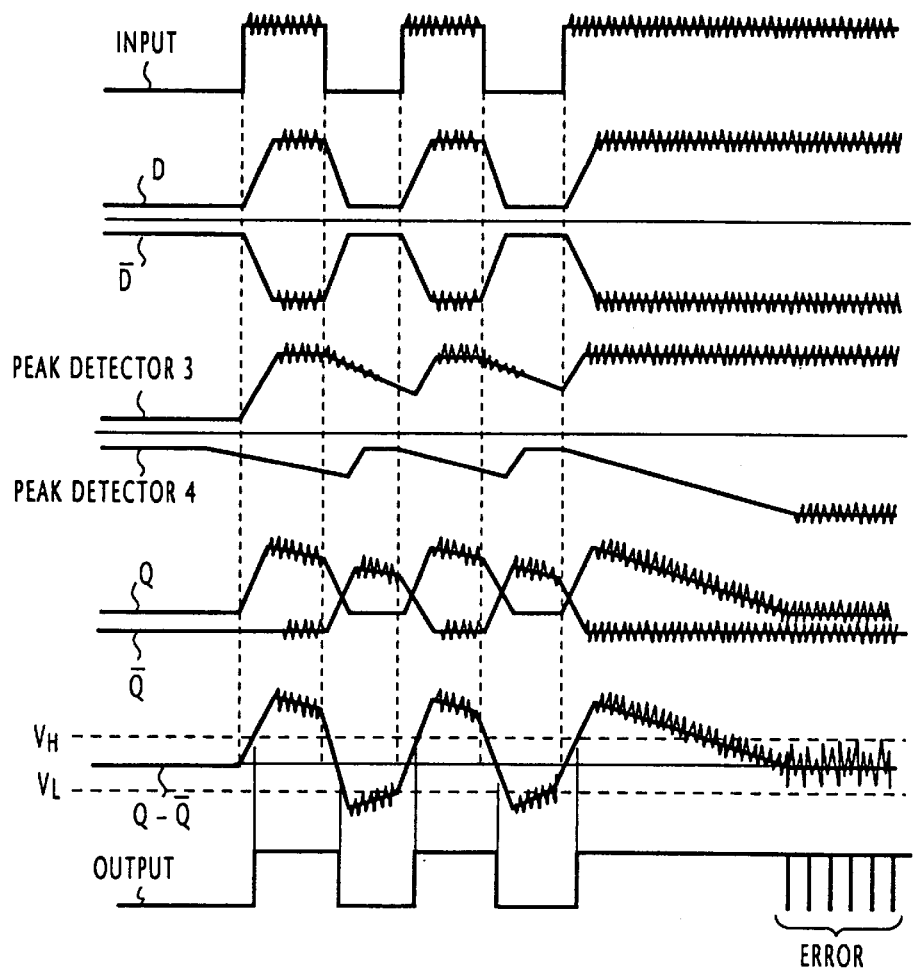
FIG. 2 is a timing diagram illustrating various waveforms appearing in the optical receiver of FIG. 1.

The operation of the optical receiver of this invention will be described with reference to FIG. 4 by assuming that the same optical input signal is applied to the receiver as that of FIG. 2.

Figure 4:
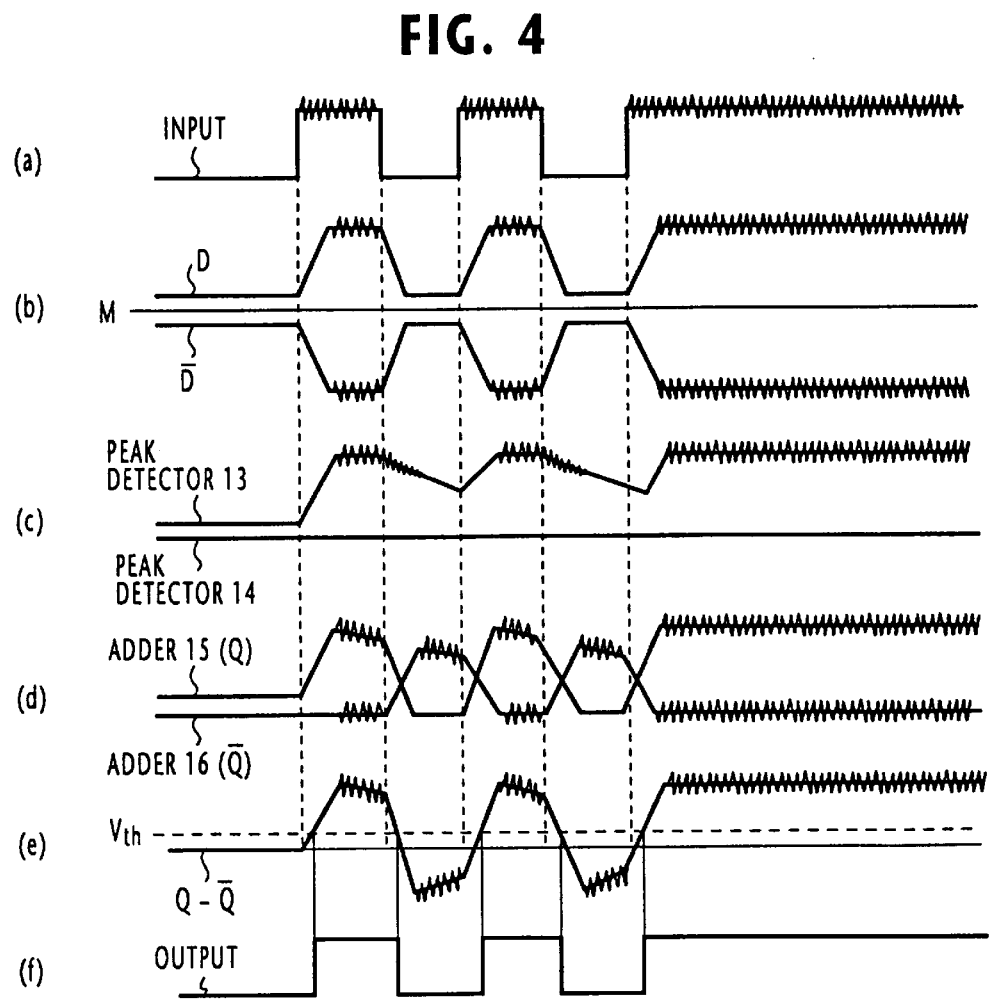
FIG. 4 is a timing diagram illustrating various waveforms appearing in the optical receiver of the present invention.

The input signal shown in part (a) of FIG. 4 is converted by the differential amplifier 12 to a pair of true and complementary varying waveforms as shown in part (b) of FIG. 4. Peak detector 13 detects peak voltages of the true output of amplifier 12 and peak detector 14 produces an output voltage corresponding to the constant level M of the voltage supply circuit 19 as shown in part (c) of FIG. 4. Adder 15 produces a sum of the true output of amplifier 12 and the constant level output of peak detector 14 and the adder 16 produces a sum of the complementary output of amplifier 12 and the peak level output of peak detector 13 as shown in part (d) of FIG. 4. Subtractor 17 produces a voltage representing the difference between the summed output voltages of adders 15 and 16 as shown in part (e) of FIG. 4 and compared by the decision circuit 18 with the threshold voltage $V_{th}$. Since the output of the peak detector 14 is constant, the difference voltage does not approach the threshold level when the input optical level remains at high level. The output of the decision circuit 18 thus contains no error pulses as shown in part (f) of FIG. 4. The bias current of the laser diode at the optical transmitter, not shown, is so adjusted that no ringing occurs when it is driven to low level. Therefore, the output signal of the decision circuit 18 is an accurate representation of the optical input level.

Figure 5:
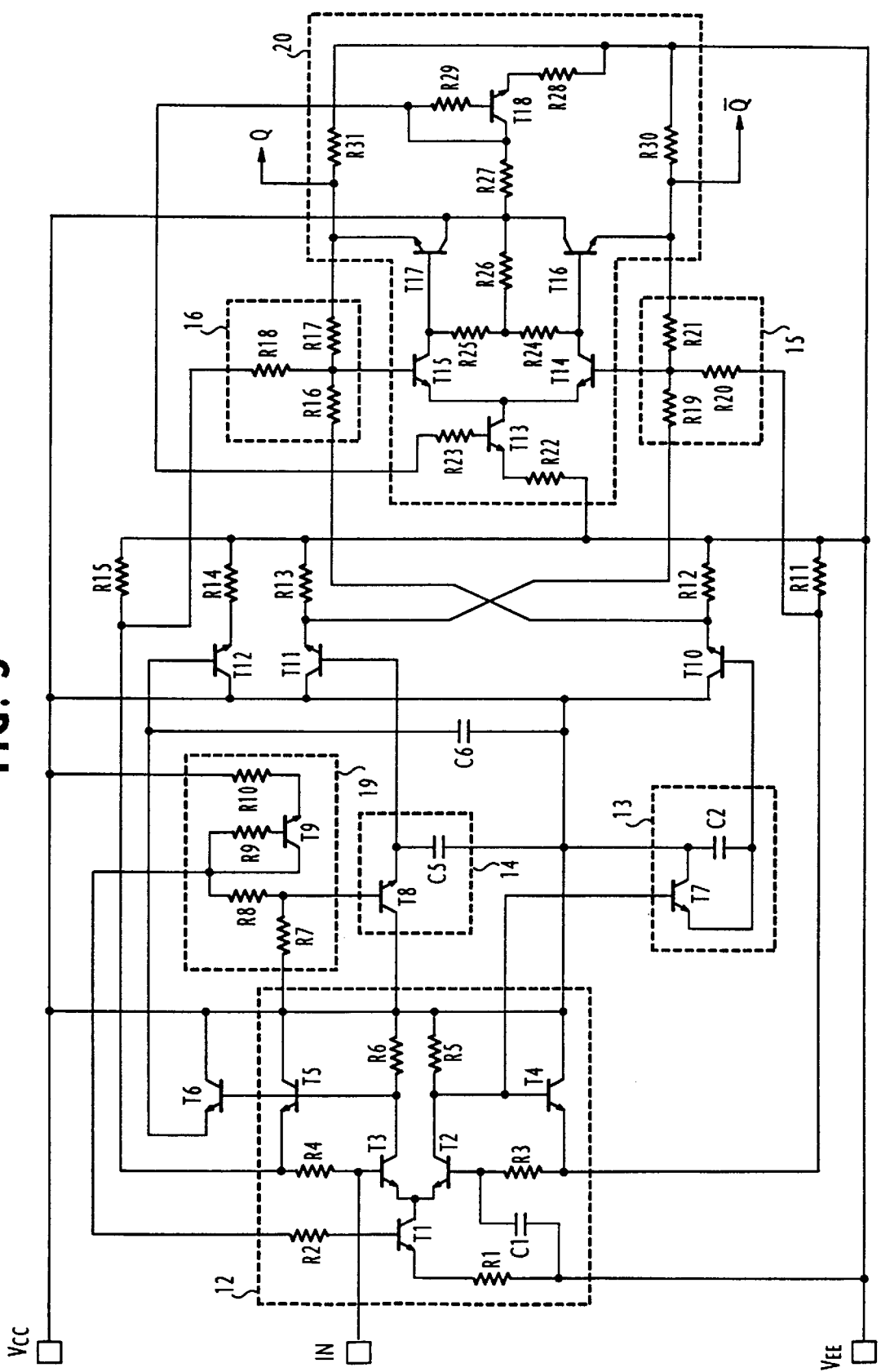
FIG. 5 is a circuit diagram of a portion of the optical receiver of the present invention.

A portion of the optical receiver is enclosed by a broken-line rectangle 10 and details of this portion are shown in the circuit diagram of FIG. 5.

Differential preamplifier 12 is of a trans-impedance amplifier configuration in which the true output is fed back to the complementary input and the complementary output is fed back to the true input. Specifically, the preamplifier comprises transistors T1 to T5, resistors R1 to R6 and a capacitor C1. Transistor T1 has its emitter coupled via resistor R1 to a voltage terminal $V_{EE}$ and its base coupled via resistor R2 to DC voltage supply circuit 19, the collector of transistor T1 being connected to a circuit node between the emitters of transistors T2 and T3. Transistor T2 has is base connected via capacitor C1 to voltage terminal $V_{EE}$ and via resistors R3 and R11 to voltage terminal $V_{EE}$. Transistor T3 has its base connected to input terminal IN and further connected via resistors R4 and R15 to voltage terminal $V_{EE}$. Transistors T4 and T5 have their collectors connected to voltage terminal $V_{CC}$ and their emitters coupled to resistors R3 and R4, respectively. The base of transistor T4 is connected to a circuit node between the collector of transistor T2 and resistor R5 and the base of transistor T5 is connected to a circuit node between the collector of transistor T3 and resistor R6, the resistors R5 and R6 being connected to the voltage terminal $V_{CC}$.

Peak detector 13 comprises a transistor T7 and a capacitor C2 which is connected across the emitter and collector of transistor T7. The base and collector of transistor T7 are connected to the base and collector of transistor T4, respectively. The collector of transistor T7 is further connected to voltage terminal $V_{CC}$. The emitter of transistor T7 is further connected to the base of a transistor T10.

Peak detector 14 comprises a transistor T8 and a capacitor C5 which is connected across the emitter and collector of transistor T8. The base of transistor T8 is connected to the DC voltage supply circuit 19 and the collector of transistor T8 is connected to the voltage terminal $V_{CC}$. The emitter of transistor T8 is further connected to the base of transistor T11.

DC voltage supply circuit 19 is of a current mirror configuration for setting a current from the preamplifier 12 as a constant current source. Specifically, it comprises resistors R7 to R10 and a transistor T9. Resistors R7, R8 and R9 are connected in series between voltage terminal $V_{CC}$ and the base of transistor T9 and resistor R10 is connected between the emitter of transistor T9 and voltage terminal $V_{CC}$. A circuit node between resistors R8 and R9 is connected via resistor R2 to the base of transistor T1 of preamplifier 12 and to this circuit node the collector of transistor T9 is also connected. Resistors R7 to R10 are determined so that a voltage developed across resistor R7 is substantially equal to an average value of voltages respectively developed across resistors R6 and R7 of the preamplifier 12. The voltage developed across resistor R7 is the constant DC voltage M, and this voltage is applied to the base of transistor T8 of peak detector 14.

Transistors T10 and T11 have their collectors coupled to voltage terminal $V_{CC}$ and their emitters respectively coupled via resistors R12 and R13 to voltage terminal $V_{EE}$. The output of peak detector 13 is amplified by transistor T10 and applied to adder 16. Adder 16 is formed with resistors R16, R17 and R18 arranged to combine the amplified peak detector output with a complementary output of amplifier 12 which appears at a circuit node between resistors R4 and R15. The output of peak detector 14 is amplified by transistor T11 and applied to adder 15, the adder 15 comprising resistors R19, R20 and R21 arranged to combine the amplified peak detector output with a true output voltage of amplifier 12 which appears at a circuit node between resistors R3 and R11.

A differential post-amplifier 20 is provided for respectively amplifying the outputs of adders 15 and 16 for application to the subtractor 7. This amplifier is formed with transistors T13 to T18 and resistors R22 to R31. Transistor T13 has its emitter coupled via resistor R22 to the voltage terminal $V_{EE}$ and its base coupled via resistor R23 to the collector of transistor T18 whose base is coupled via resistor R29 to its collector. Transistors T14 and T15 have their emitters coupled together to the collector of transistor T13 and their collectors coupled to the bases of transistors T16 and T17, respectively. The base of transistor T14 is connected to the circuit node of resistors R19 to R21 and the base of transistor T15 is connected to the circuit node of resistors R16 to R18. Resistors R24 and R25 are connected in series across the collectors of transistors T14 and T15, the circuit node between R24 and R25 being connected via resistor R26 to voltage terminal $V_{CC}$. Transistors T16 and T17 have their collectors connected to voltage terminal $V_{CC}$ and their bases connected to resistors R21 and R17, respectively. Transistor T18 has its collector connected via resistor R27 to voltage terminal $V_{CC}$. The emitter of transistor T18 is connected via resistor R28 to voltage terminal $V_{EE}$ to which the emitters of transistors T16 and T17 are also connected via resistors R30 and R31. The amplified output of adder 16 is taken from the circuit node between resistors R17 and R31 and the amplified output of adder 15 is taken from the circuit node between resistors R21 and R30.

In order to establish a balance between the circuit formed by transistors T7, T10, capacitor C2 and resistor R12, a transistor T6 is provided having its base and collector coupled to those of transistor T5 and its emitter coupled to the base of a transistor T12, the collector-emitter path of transistor T12 and a resistor R14 being connected between voltage terminals $V_{CC}$ and $V_{EE}$.

Figure 6:
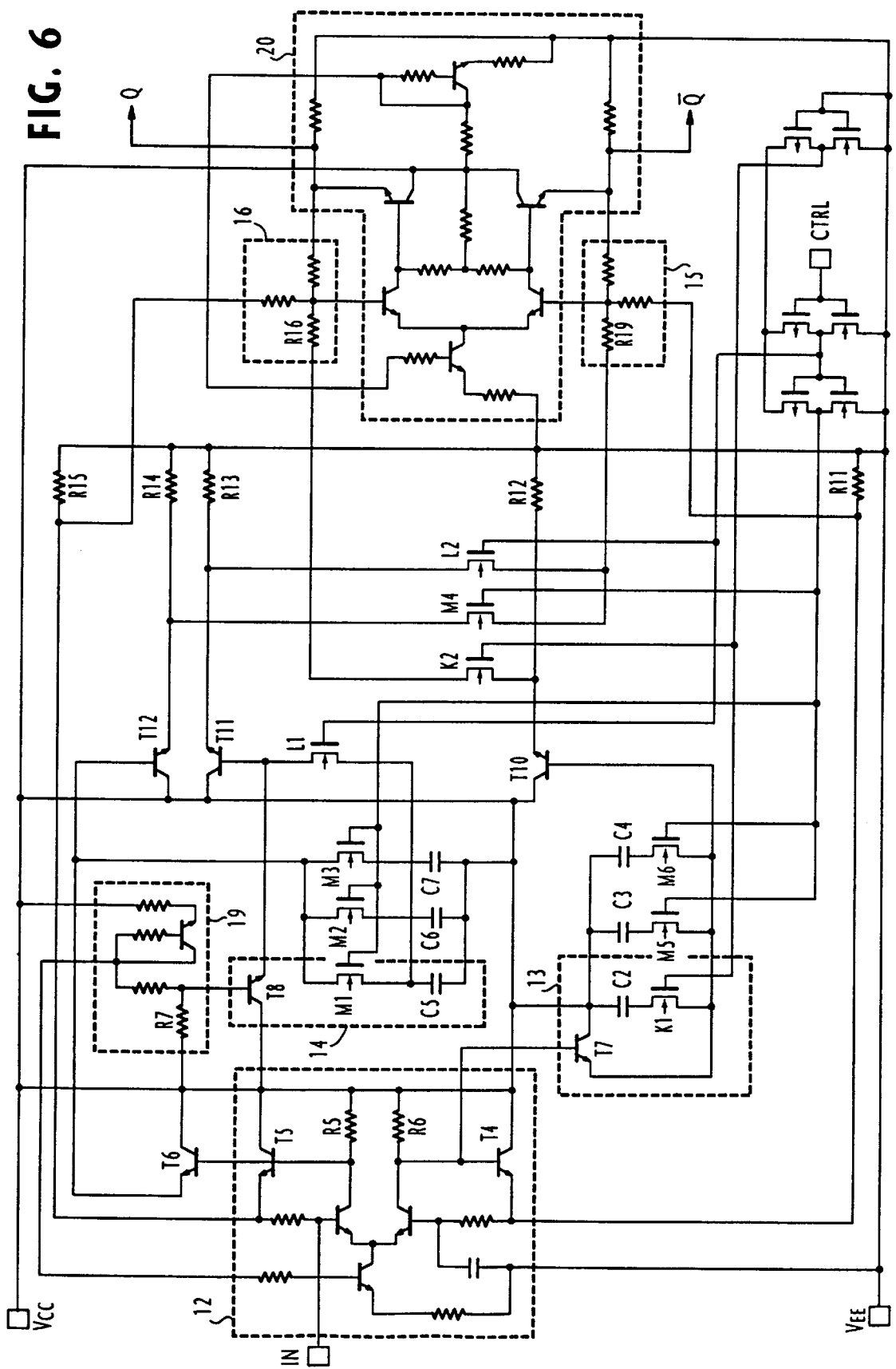
FIG. 6 is a circuit diagram of a portion of a dual mode optical receiver according to the present invention.

The optical receiver of FIG. 5 is modified into a dual mode optical receiver as shown in FIG. 6 by additionally including capacitors C3, C4 and C7 and metal oxide field-effect transistors as switching elements which are classified as K, L and M groups. MOSFET switches K1 and K2 are always biased at a constant voltage for coupling capacitor C2 to transistor T17 and the emitter of transistor T10 to the adder 16, regardless of operational modes.

In a DC mode of operation, MOSFET switches L1 and L2 are turned on in response to a DC-mode control signal (e.g., slightly lower than the voltage at terminal $V_{EE}$) supplied to a control terminal CTRL for coupling capacitor C5 to transistor T18 to form the peak detector 14 and coupling the emitter of transistor T11 to the adder 15, while switches M1 to M5 are turned off. The DC-mode optical receiver operates in a characteristic identical to that shown in FIG. 4.

In an AC mode, MOSFET switches L1 and L2 are turned off and M1 to M6 are turned on in response to an AC-mode control signal (e.g., slightly higher than the voltage at terminal $V_{CC}$) supplied to the control terminal CTRL. The turn-on of switches M1 to M3 causes capacitors C5, C6 and C7 to be connected in parallel across the emitter and collector of transistor T6 to form a first peak detector. The turn-on of switch M4 establishes a connection between the emitter of transistor T12 to the adder 15, so that the output of the first peak detector is applied to the adder 15. The turn-on of switches M5 and M6 causes capacitors C3 and C4 to be connected in parallel with capacitor C2 across the emitter and collector of transistor T7 to form a second peak detector identical in characteristic to the first peak detector. The output of the second peak detector is supplied through transistor T10 and switch K2 to the adder 16. It is seen that, during the AC mode, the transistors T8 is disconnected from capacitor C5 and the transistor T11 is disconnected from the adder 15. Therefore, the AC-mode optical receiver operates in a characteristic identical to that shown in FIG. 2.

It is seen that, in DC mode, the peak detectors have low capacitance value and in AC mode their capacitance value is increased. The lower capacitance value of the DC mode makes the optical receiver quickly respond to the varying input level, while the higher capacitance value of the AC mode has the effect of reducing the leakage of the peak detectors.

What is claimed is:

1. A circuit arrangement comprising:
   an amplifier for producing a true output signal and a complementary output signal in response to a digital input signal;
   a peak detector for receiving the true output signal;
   a first adder for summing the complementary output signal and an output signal of the peak detector;
   a second adder for summing the true output signal and a predetermined constant voltage;
   means for detecting a difference between an output signal of the first adder and an output signal of the second adder; and
   a decision circuit for making a decision on said difference and producing therefrom a digital output signal.

2. A circuit arrangement as claimed in claim 1, wherein the peak detector operates as a first peak detector, further comprising:
   a DC voltage source for producing said predetermined constant voltage; and
   a second peak detector connected between said DC voltage source and said second adder, said second peak detector having a substantially similar operating characteristic to an operating characteristic of the first peak detector.

3. A circuit arrangement as claimed in claim 1, wherein said predetermined constant voltage is substantially equal to an average value of the true and complementary output signals.

4. A circuit arrangement as claimed in claim 1, further comprising a photodiode for converting an optical digital input signal to a corresponding electrical signal and supplying the electrical signal to said amplifier as said digital input signal.

5. A circuit arrangement as claimed in claim 2, wherein said DC voltage source is formed as part of said amplifier.

6. A circuit arrangement as claimed in claim 2, wherein said predetermined constant voltage is substantially equal to an average value of the true and complementary output signals.

7. A circuit arrangement as claimed in claim 2, further comprising a photodiode for converting an optical digital input signal to a corresponding electrical signal and supplying the electrical signal to said amplifier as said digital input signal.

8. A circuit arrangement comprising:
an amplifier for producing a true output signal and a complementary output signal in response to a digital input signal;
a first peak detector for receiving the true output signal;
a second peak detector for receiving a predetermined constant voltage;
a first adder for summing the complementary output signal with an output signal of the first peak detector;
a second adder for receiving the true output signal;
switching circuitry, responsive to a first control signal, for causing said predetermined constant voltage to be summed by the second adder with the true output signal, and responsive to a second control signal, for causing an output signal of the second peak detector to be summed by the second adder;
means for detecting a difference between an output signal of the first adder and an output signal of the second adder; and
a decision circuit for making a decision on said difference and producing therefrom a digital output signal.

9. A circuit arrangement as claimed in claim 8, wherein each of said first and second peak detectors has a variable time constant value, and wherein said switching circuitry comprises means for setting the time constant values of said first and second peak detectors at a lower value in response to said first control signal, and setting the time constant values of said first and second peak detectors at a higher value in response to said second control signal.

10. A circuit arrangement as claimed in claim 8, wherein said first and second peak detectors have substantially similar time constant values to each other.

11. A circuit arrangement as claimed in claim 8, wherein said predetermined constant voltage is substantially equal to an average value of the true and complementary output signals.

12. A circuit arrangement as claimed in claim 8, further comprising a photodiode for converting an optical digital input signal to a corresponding electrical signal and supplying the electrical signal to said amplifier as said digital input signal.

13. A circuit arrangement as claimed in claim 8, wherein said amplifier includes a DC voltage source for producing said predetermined constant voltage.

14. A circuit arrangement as claimed in claim 9, wherein said predetermined constant voltage is substantially equal to an average value of the true and complementary output signals.

15. A circuit arrangement as claimed in claim 9, further comprising a photodiode for converting an optical digital input signal to a corresponding electrical signal and supplying the electrical signal to said amplifier as said digital input signal.

16. An optical receiver comprising:
a photodiode for converting an optical digital input signal to a corresponding electrical digital signal;
an amplifier for producing a true output signal and a complementary output signal in response to said electrical digital signal;
a peak detector for receiving the true output signal;
a first adder for summing the complementary output signal and an output signal of the peak detector;
a second adder for summing the true output signal and a predetermined constant voltage;
means for detecting a difference between an output signal of the first adder and an output signal of the second adder; and
a decision circuit for making a decision on said difference and producing therefrom a digital output signal.

17. An optical receiver as claimed in claim 16, wherein the peak detector operates as a first peak detector, further comprising:
a DC voltage source for producing said predetermined constant voltage; and
a second peak detector connected between said DC voltage source and said second adder, said second peak detector having a substantially similar operating characteristic to an operating characteristic of the first peak detector.

18. An optical receiver as claimed in claim 16, wherein said predetermined constant voltage is substantially equal to an average value of the true and complementary output signals.

19. An optical receiver as claimed in claim 16, further comprising a photodiode for converting an optical digital input signal to a corresponding electrical signal and supplying the electrical signal to said amplifier as said digital input signal.

20. An optical receiver as claimed in claim 17, wherein said DC voltage source is formed as part of said amplifier.

21. An optical receiver as claimed in claim 17, wherein said predetermined constant voltage is substantially equal to an average value of the true and complementary output signals.

22. An optical receiver as claimed in claim 17, further comprising a photodiode for converting an optical digital input signal to a corresponding electrical signal and supplying the electrical signal to said amplifier as said digital input signal.

23. An optical receiver comprising:
a photodiode for converting an optical digital input signal to a corresponding electrical digital signal;
an amplifier for producing a true output signal and a complementary output signal in response to the electrical digital signal;
a first peak detector for receiving the true output signal;
a second peak detector for receiving a predetermined constant voltage;
a first adder for summing the complementary output signal with an output signal of the first peak detector;
a second adder for receiving the true output signal;
switching circuitry, responsive to a first control signal, for causing said predetermined constant voltage to be summed by the second adder with the true output signal, and responsive to a second control signal, for causing an output signal of the second peak detector to be summed by the second adder;
means for detecting a difference between an output signal of the first adder and an output signal of the second adder; and
a decision circuit for making a decision on said difference and producing therefrom a digital output signal.

24. An optical receiver as claimed in claim 23, wherein each of said first and second peak detectors has a variable time constant value, and wherein said switching circuitry comprises means for setting the time constant values of said first and second peak detectors at a lower value in response to said first control signal, and setting the time constant values of said first and second peak detectors at a higher value in response to said second control signal.

25. An optical receiver as claimed in claim 23, wherein said first and second peak detectors have substantially similar time constant values to each other.

26. An optical receiver as claimed in claim 23, wherein said predetermined constant voltage is substantially equal to an average value of the true and complementary output signals.

27. An optical receiver as claimed in claim 23, further comprising a photodiode for converting an optical digital input signal to a corresponding electrical signal and supplying the electrical signal to said amplifier as said digital input signal.

28. An optical receiver as claimed in claim 23, wherein said amplifier includes a DC voltage source for producing said predetermined constant voltage.

29. An optical receiver as claimed in claim 24, wherein said predetermined constant voltage is substantially equal to an average value of the true and complementary output signals.

30. An optical receiver as claimed in claim 25, further comprising a photodiode for converting an optical digital input signal to a corresponding electrical signal and supplying the electrical signal to said amplifier as said digital input signal.

* * * * *